(12) United States Patent
Gambino et al.

(10) Patent No.: US 11,120,941 B2
(45) Date of Patent: Sep. 14, 2021

(54) METHODS OF FORMING CAPACITORS

(71) Applicant: SEMICONDUCTOR COMPONENTS INDUSTRIES, LLC, Phoenix, AZ (US)

(72) Inventors: Jeffrey Peter Gambino, Gresham, OR (US); Bruce Greenwood, Gresham, OR (US); Angel Rodriguez, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 220 days.

(21) Appl. No.: 16/242,247

(22) Filed: Jan. 8, 2019

(65) Prior Publication Data

US 2019/0228908 A1 Jul. 25, 2019

Related U.S. Application Data

(60) Provisional application No. 62/621,265, filed on Jan. 24, 2018.

(51) Int. Cl.
*H01G 4/008* (2006.01)
*H01G 4/10* (2006.01)
*H01L 27/146* (2006.01)
*H01L 49/02* (2006.01)

(52) U.S. Cl.
CPC .............. *H01G 4/008* (2013.01); *H01G 4/10* (2013.01); *H01L 27/14634* (2013.01); *H01L 28/91* (2013.01); *H01L 27/14609* (2013.01); *H01L 28/60* (2013.01)

(58) Field of Classification Search
CPC ........ H01G 4/008; H01G 4/012; H01G 4/085; H01G 4/10; H01G 4/33
See application file for complete search history.

(56) References Cited

U.S. PATENT DOCUMENTS

| | | | | |
|---|---|---|---|---|
| 6,387,750 B1 * | 5/2002 | Lai | ...................... | H01L 27/0805 257/E21.02 |
| 6,506,660 B2 * | 1/2003 | Holmes | .................... | H01L 28/92 257/E21.02 |
| 6,825,080 B1 * | 11/2004 | Yang | ...................... | H01L 28/90 257/301 |
| 8,900,963 B2 * | 12/2014 | Sills | .................... | H01L 45/1658 438/381 |
| 2019/0228908 A1 * | 7/2019 | Gambino | ............... | H01G 4/008 |

OTHER PUBLICATIONS

Segalman, R.A., Patterning with block Copolymer Thin Films, Materials Science and Engineering, R48, 2005, pp. 191-226.

(Continued)

*Primary Examiner* — Minh N Trinh
(74) *Attorney, Agent, or Firm* — Adam R. Stephenson, LTD.

(57) ABSTRACT

Implementations of methods of forming capacitors may include depositing a first metal layer over a substrate, forming a photoresist layer over the first metal layer, patterning the photoresist layer, patterning the first metal layer using the pattern of the photoresist layer, depositing a dielectric layer over the first metal layer, and depositing a second metal layer over the dielectric layer to form a metal-insulator-metal capacitor.

20 Claims, 13 Drawing Sheets

(56) References Cited

OTHER PUBLICATIONS

Gu, et al., Pattern Transfer Using Block Copolymers, Phil Trans R Spc A 371:20120306, 2013, 35 pages.
Hillmyer, M.A., Nanoporous Materials from Block Copolymer Precursors, Adv Polym Sci, 190, pp. 137-181.
Meynants, G., Global Shutter Image Sensors—Solid State Technology, The ConFab Conference, Las Vegas, NV, Jun. 12-15, 2016, 10 pages.
Velichko, et al., Low Noise High Efficiency 3.75 um and 2.8 um Global Shutter—CMOS Pixel Arrays, International Image Sensor Workshop, 2013, 4 pages.
Black, et al., Highly Porous Silicon Membrane Fabrication Using Polymer Self-assembly, J. Vac. Sci. Technol., B 24(6), Nov./Dec. 2005, pp. 3188-3191.
Sakao, et al., A Capacitor-over-bit-line (COB) Cell with a Hemispherical-grain Stoage Node for 64mb DRaMs, IEEE, 1990, pp. 655-658.
Black, et al., Integration of Self-assembled Diblock Copolymers for Semiconductor Capacitor Fabrication, Applied Physics Letters, vol. 79, No. 3, Jul. 16, 2001, pp. 409-411.
Baskaran, et al., Directed Self-assembly of topcost-free Integration-freindly High-X Block Copolymers, Proceedings of SPIE—The International Society for Optical Engineering, Mar. 2015, 12 pages.
Liu, et al., Pattern Transfer Using poly(styrene-block-methyl methacrylate) Copolymer Films and Reactive ion Etching, J. Vac. Sci., B25(6), Nov./Dec. 2007, pp. 1963-1968.

\* cited by examiner

METHODS OF FORMING CAPACITORS

CROSS REFERENCE TO RELATED APPLICATIONS

This document claims the benefit of the filing date of U.S. Provisional Patent Application 62/621,265, entitled "Capacitors With Electrode Topography" to Greenwood et. al. which was filed on Jan. 24, 2018, the disclosure of which is hereby incorporated entirely herein by reference.

BACKGROUND

1. Technical Field

Aspects of this document relate generally to capacitors. More specific implementations involve capacitors used in semiconductor devices, such as an image sensor.

2. Background

Capacitors are used to store electrical energy and include two conductors separated by a non-conductive region. Capacitors are used in electrical circuits which can be found in electrical devices, such as cameras, automobiles and computers.

SUMMARY

Implementations of methods of forming capacitors may include depositing a first metal layer over a substrate, forming a photoresist layer over the first metal layer, patterning the photoresist layer, patterning the first metal layer using the pattern of the photoresist layer, depositing a dielectric layer over the first metal layer, and depositing a second metal layer over the dielectric layer to form a metal-insulator-metal capacitor.

Implementations of methods of forming capacitors may include one, all, or any of the following:

A capacitance of the capacitor may be greater than or equal to 25 femtofarads/square micron.

Patterning the first metal layer may include forming a plurality of openings in the first metal layer, the patterned first metal layer including a pitch of 120 nm wide.

Patterning the first metal layer may include forming a plurality of openings in the first metal layer, each opening including a depth 60 nm deep.

Implementations of methods of forming capacitors may include depositing a first metal layer over a substrate, coupling a diblock copolymer over the first metal layer, selectively removing a portion of the diblock copolymer, patterning the metal layer using a remaining portion of the diblock copolymer, depositing a dielectric layer over the first metal layer, and depositing a second metal layer over the dielectric layer to form a metal-insulator-metal (MIM) device.

Implementations of methods of forming capacitors may include one, all, or any of the following:

The first metal layer may be a lower electrode.

The second metal layer may be an upper electrode.

The first metal layer may be a seed layer.

The method may include coupling a third metal layer between the first metal layer and the dielectric layer. The third metal layer may be a lower electrode.

The first metal layer and the second metal layer may include titanium.

The method may include coupling a tungsten layer between the first metal layer and the substrate.

A capacitance of the capacitor may be greater than or equal to 25 femtofarads/square micron.

Implementations of methods of forming capacitors may include depositing a first metal layer over a substrate, depositing a second metal layer over the first metal layer, depositing a third metal layer over the second metal layer, forming a diblock copolymer over the third metal layer, and selectively removing a portion of the diblock copolymer. The method may also include patterning the third metal layer using a remaining portion of the diblock copolymer, removing the remaining portion of the diblock copolymer, depositing a dielectric layer over the third metal layer, and depositing a fourth metal layer over the dielectric layer to form a metal-insulator-metal (MIM) device.

Implementations of methods of forming capacitors may include one, all, or any of the following:

The method may include depositing a fifth metal layer between the second metal layer and the third metal layer.

The fifth metal layer may include tungsten.

The diblock copolymer may include polystyrene and polymethylmethacrylate.

Patterning the third metal layer may include etching partially through the third metal layer.

Patterning the third metal layer may include forming a plurality of openings in the third metal layer, each opening having a depth of 30 nm.

Patterning the third metal layer may include forming a plurality of openings in the third metal layer, the patterned third metal layer having a pitch 60 nm wide.

The first metal layer and the third metal layer may include titanium and the second metal layer may include aluminum.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended capacitors will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such capacitors, and implementing components and methods, consistent with the intended operation and methods.

Various implementations of capacitor designs disclosed in this document may result an increasing and/or doubling of capacitance for the same dielectric material for a metal-insulator-metal (MIM) capacitor and prevent the need to double stack MIM capacitors by being able to use just one rather than two capacitors to achieve the needed capacitance. Various capacitor implementations and methods of manufacturing the same along with various pixel and supporting circuitry designs along with methods of making the same are disclosed herein. While the capacitors disclosed herein are generally considered MIM capacitors, the metal layers within the MIM capacitor could be replaced by another electrically conductive material to form a capacitor that is not a MIM capacitor.

Figure 1:
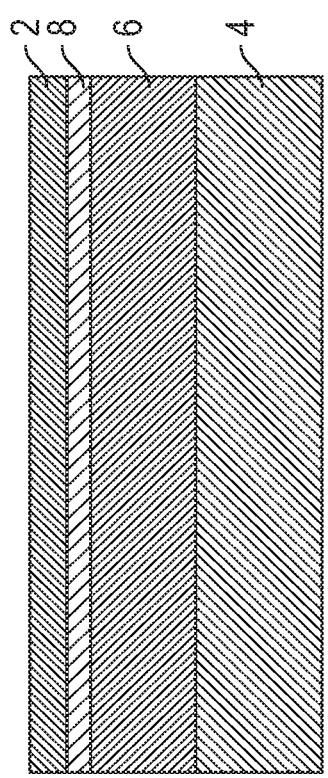
FIG. 1 is a cross sectional side view of an implementation of a metal layer coupled over a substrate.

Referring to FIGS. 1-5, an implementation of a semiconductor device following various implementations of method steps of a method of forming a capacitor having electrode topography is illustrated. Referring specifically to FIG. 1, a cross sectional side view of a first metal layer 2 coupled over a substrate 4 is illustrated. The metal layer may include, by non-limiting example, tungsten, aluminum, titanium (Ti), titanium nitride (TiN), any other metal, metal alloy, and any combination thereof. In other implementations, a non-metal conductive layer, such as polysilicon, may be used in place of the metal layer. The first metal layer may be the lower electrode of the capacitor to be formed. As used herein, "lower" is understood as being the electrode or layer closer to the substrate 4. Non-limiting examples of semiconductor substrates 4 that may be included in the implementations disclosed in this document include single crystal silicon, silicon dioxide, glass, silicon-on-insulator, silicon carbide, gallium arsenide, sapphire, ruby, polycrystalline or amorphous forms of any of the foregoing, and any other substrate type useful for constructing semiconductor devices. In various implementations, and as illustrated by FIG. 1, an electrically insulative layer 6, which may include a dielectric material, may be coupled between the substrate 4 and the first metal layer 2. In particular implementations, the insulative layer 6 may include silicon dioxide. Similarly, a conductive layer 8 may be coupled between the first metal layer 2 and the substrate 4. The conductive layer 8 may be any type of one or more metals, any combination thereof, or any alloy thereof. In particular implementations the conductive layer 8 includes tungsten. The conductive layer 8 and the first metal layer 2 may together may be considered a lower electrode stack.

Figure 2:
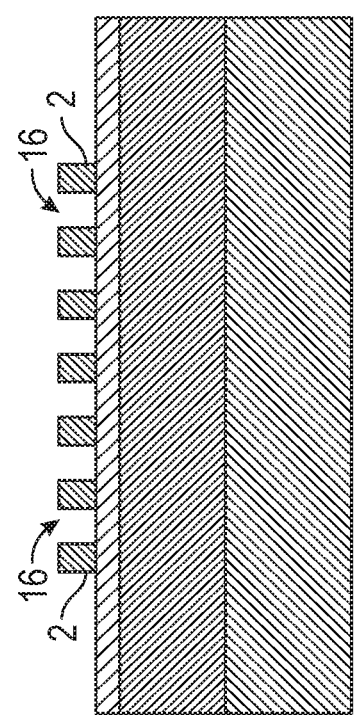
FIG. 2 is a cross sectional side view of the metal layer of FIG. 1 patterned.

Referring to FIG. 2, a cross sectional side view of the metal layer of FIG. 1 patterned is illustrated. In various implementations, the method of forming the capacitor may include forming a photoresist layer over the first metal layer and patterning the first photoresist layer. The photoresist layer may then be used to pattern the first metal layer 2 and may be removed after the first metal layer is patterned. In this manner, the first metal layer 2 may be patterned using lithography. As illustrated, the resulting lithographic patterning of the first metal layer 2 forms a plurality of openings 16 in the first metal layer 2. In various implementations, the plurality of openings may include various widths. The pitch between the portions of the patterned metal layer adjacent to the openings may be about 120 nm, while in other implementations the pitch may be more or less than 120 nm. Similarly, in various implementations the plurality of openings may include a depth of about 60 nm while in other implementations the plurality of openings may include a depth of more than or less than 60 nm. In implementations where the pitch is about 120 nm and the depth is about 60 nm (or other implementations where the pitch is about twice the depth), the resulting capacitance of the capacitor formed may increase by about two times.

Figure 3:
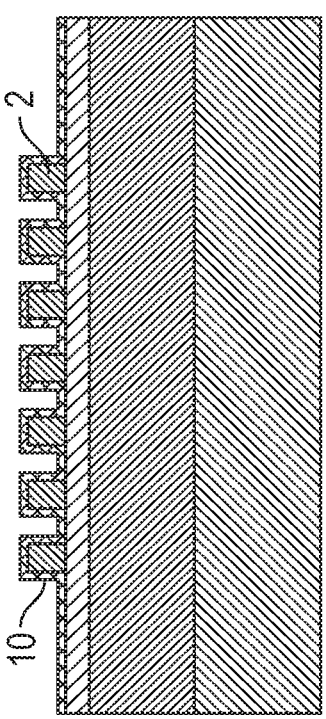
FIG. 3 is a cross sectional side view of an implementation of a dielectric layer coupled over the patterned metal layer of FIG. 2.

Referring to FIG. 3, a cross sectional side view of a dielectric layer coupled over the patterned metal layer of FIG. 2 is illustrated. In various implementations, the method of forming the capacitor may include depositing a dielectric layer 10 over the first metal layer 2. The dielectric layer may be deposited using chemical-vapor deposition (CVD). Any of a wide variety of dielectric materials capable of deposition using CVD may be used in various implementations and various thicknesses of the dielectric layer may be used in various implementations. The dielectric materials may include, by non-limiting example, silicon dioxide, silicon nitride, a high dielectric constant (HiK, higher than the dielectric constant of silicon dioxide) dielectric material, or any combination thereof.

Figure 4:
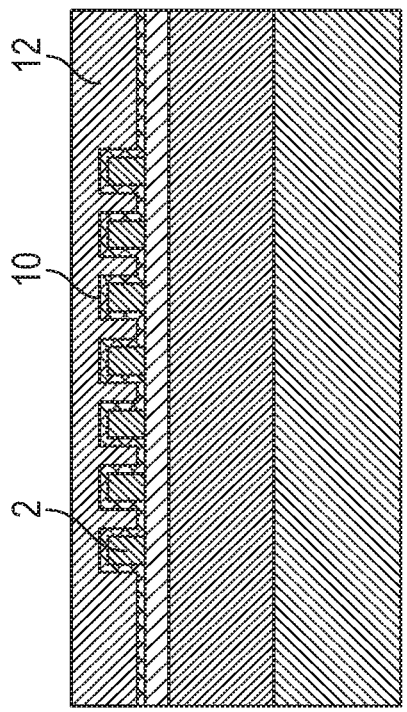
FIG. 4 is a cross sectional side view of an implementation of a second metal layer coupled over the dielectric layer of FIG. 3.
Figure 5:
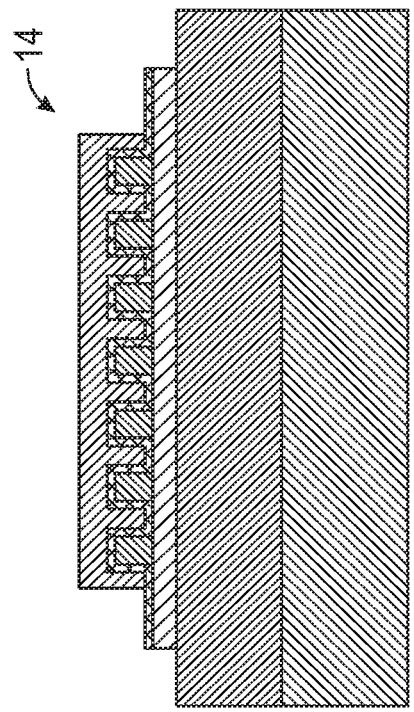
FIG. 5 is a cross sectional side view of a first implementation of a metal-insulator-metal (MIM) capacitor.

Referring to FIG. 4, a cross sectional side view of a second metal layer coupled over the dielectric layer of FIG. 3 is illustrated. In various implementations, the method of forming a capacitor includes depositing a second metal layer 12 over the dielectric layer 10 to form a MIM capacitor. The second metal layer 12 may include any type of metal disclosed herein. The second metal layer 12 may form the upper electrode of the capacitor. As used herein, "upper" is understood to mean the electrode furthest from the substrate 4 in relation to the "lower" electrode. As illustrated, in various implementations, including any implementation disclosed herein, the second metal layer 12 may, after deposition, be planarized following deposition (by polishing and/or by using chemical mechanical planarization (CMP) in various implementations) to ensure the top layer of the capacitor forms a plane substantially parallel with a plane formed by the substrate 4 or insulative layer 6. Referring to FIG. 5, a cross sectional side view of a first implementation of a MIM capacitor is illustrated. In various implementations, following planarization, additional patterning steps may be employed to shape the final edges of the MIM capacitor 14 and connect it with various vias and other structures to allow charge to be stored and discharged from the structure. These subsequent steps of forming the MIM capacitor involve patterning using lithography or any other method of patterning.

The increase in surface area of the resulting capacitor 14 with the lower electrode having topography can be estimated by using a radius for each of the openings formed. Where the underlying pitch of the pattern of the patterned lower electrode is 120 nm and the depth of the openings is 60 nm, using the area of the resulting openings ($2\pi r^2$), the resulting film increases the capacitance of the MIM capacitor by about 2 times over the equivalent planar MIM capacitor design. In other particular implementations, the capacitance can be substantially doubled by selecting a pitch about twice the amount of the depth of the openings. Each of the various patterns of metal layers disclosed herein will result in a MIM capacitor with varying capacitance; however, all of these versions will have greater surface area and thus greater capacitance than a planar MIM capacitor of the same planar size but with no topography. In particular implementations, including the implementations disclosed herein, the resulting capacitance of each capacitor may be greater than or equal to 25 femtofarads/square micron.

Figure 6:
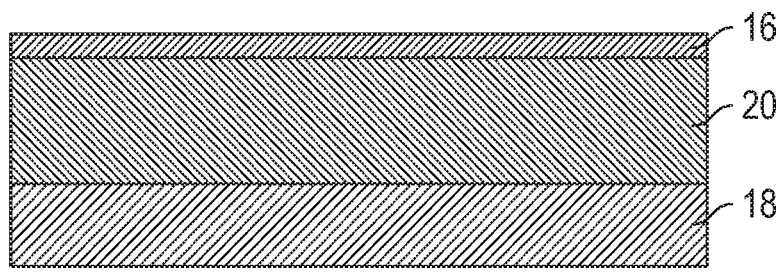
FIG. 6 is a cross sectional side view of an implementation of a first metal layer coupled over a substrate.

Referring to FIGS. 6-13, another implementation of a semiconductor device following various method steps of a method of forming a capacitor is illustrated. Referring specifically to FIG. 6, a cross sectional side view of a first metal layer coupled over a substrate is illustrated. The method of forming a capacitor may include forming a first metal layer 16 over a substrate 18. The first metal layer 16 may be a seed layer. The first metal layer 16 may be any type of metal disclosed herein and may be formed using, by non-limiting example, sputtering, evaporation, deposition, or any other method of metal deposition. The substrate may be any type of substrate disclosed herein. In various implementations, an insulative layer 20 (which may be the same as any insulative layer disclosed herein) may be coupled between the first metal layer 16 and the substrate 18.

Figure 7:
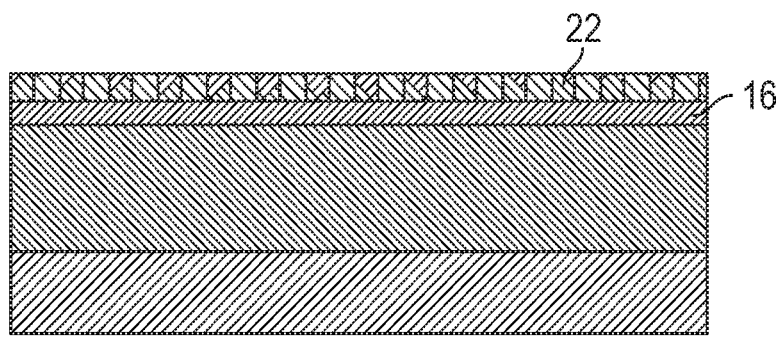
FIG. 7 is a cross sectional side view of an implementation of a diblock copolymer coupled over the first metal layer of FIG. 6.

Referring to FIG. 7, a cross sectional side view of a diblock copolymer coupled over the first metal layer of FIG. 6 is illustrated. In various implementations, the method of forming a capacitor may include coupling a diblock copolymer 22 over the first metal layer. In various implementations the diblock copolymer may include polymethylmethacrylate (PMMA) and polystyrene (PS), however, a wide variety of different types of diblock copolymers could be used in this and in the other various implementations disclosed herein which may be formed by a wide variety of methods of forming a diblock copolymer. For example, a neutral layer may be first applied to the substrate using spin coating and baked then solvent rinsed. Then the block copolymer solution may then be cast on top of the neutral layer. The block copolymer may then be etched selectively using plasma etching or solvent washing to selectively remove one of the block copolymer domains.

Figure 8:
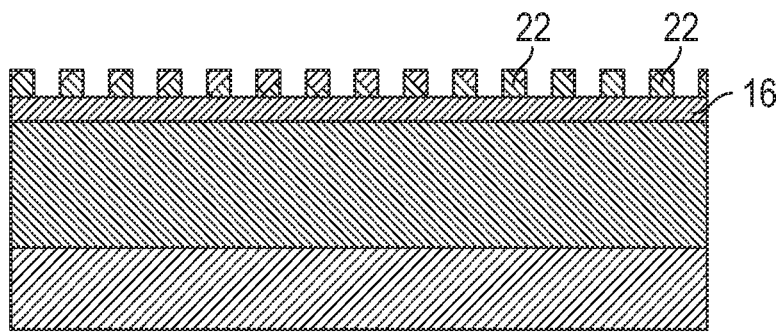
FIG. 8 is a cross sectional side view of the diblock copolymer of FIG. 7 patterned.
Figure 9:
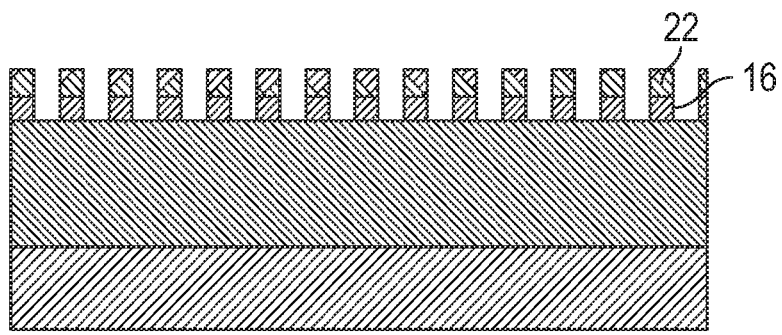
FIG. 9 is a cross sectional side view of the first metal layer of FIG. 8 patterned.

Referring to FIG. 8, a cross sectional side view of the diblock copolymer of FIG. 7 following patterning is illustrated. In various implementations, the method of forming a capacitor may include selectively removing a portion of the diblock copolymer. Referring to FIG. 9, a cross sectional side view of the first metal layer of FIG. 8 patterned is illustrated. The method of forming a capacitor may include patterning the first metal layer 16 using a remaining portion of the diblock copolymer 22. By removing a portion of the diblock copolymer 22, the diblock copolymer can be used to form a pattern on the first metal layer 16 that takes a variety of microscopic yet ordered forms, such as, by non-limiting example, posts, pillars, wavy lines, lamellar structures, straight lines, holes, and any other microscopic structure that can be created using the polymer system. The structure is formed as the copolymer system self-aligns and arranges the polymer film into areas where PMMA predominates and areas for the PS predominates. As illustrated, the thickness of the PMMA/PS layer may be 50 nanometers in various implementations, though thicker or thinner layers may be employed in various implementations.

In the implementation illustrated by FIGS. 7-8, following the application of the PMMA/PS diblock copolymer, the PMMA is selectively etched relative to the PS to create a PS remaining pattern. As illustrated, two options may be used for the etch, the first being a ultraviolet light exposure of the PMMA/PS film followed by a rinse/development step using isopropyl alcohol (IPA) and the second being a lower power oxygen reactive ion etch (ME). The first option hardens the PS material so that the IPA only removes the PMMA. The second option selectively etches the PMMA relative to the PS with the oxygen plasma. In other implementations, select portions of the diblock copolymer may be removed through rinsing with a particular solvent rather than an etch.

Following the patterning of the PS, the posts, or remaining portions of the diblock copolymer are very uniform in size, but did not require the use of any traditional photolithographic methods to form them. They are also very small, on the order of tens of nanometers in size, which are difficult to image with traditional photolithographic processes, even using extreme UV, x-ray lithography, or immersion lithography techniques. Because of this, the use of diblock copolymer systems may be a more cost effective way to finely pattern the first metal layer of the MIM capacitor implementations.

Following the use of either patterning option, the resulting PS pattern is used in a reactive ion etch process to etch the lower electrode. The first metal layer may be patterned to include a plurality of openings having any depth disclosed herein. In particular implementations, the openings may include a depth of about 30 nm. Similarly, the pitch between the portions of the first metal layer adjacent to the openings may be any pitch disclosed herein, and in particular implementations, may be 60 nm. The remaining PS is then removed using, by non-limiting example, an ashing or solvent cleaning process (not illustrated). As illustrated by FIG. 9, at this point, the first metal layer has a pattern corresponding with the pattern formed by the diblock copolymer system. This patterned metal layer is one of the particular aspects of this disclosure, as the patterning enables all of the various electrodes with topography to be created as disclosed in various method implementations in this document. Though the intermediate step is not illustrated, the method includes removing the remaining diblock copolymer, which may be the PS portion of the copolymer.

Figure 10:
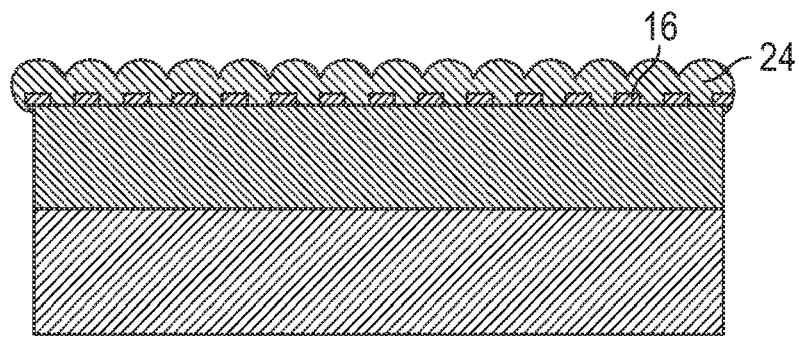
FIG. 10 is a cross sectional side view of an implementation of a third metal layer coupled over the first metal layer of FIG. 9.

Referring to FIG. 10, a cross sectional side view of a third metal layer coupled over the first metal layer of FIG. 9 is illustrated. In various implementations, and as illustrated by FIG. 10, the method of forming a capacitor may include depositing a lower electrode (or a third metal layer 24) over the patterned seed layer (or the first metal layer 16). In various implementations, the first metal layer 16 and the third metal layer 24 may be considered as part of a lower electrode stack. The third metal layer 24 may be any type of metal, combination thereof, or alloy thereof, and may be deposited using CVD, atomic layer deposition (ALD), or physical vapor deposition (PVD). In various implementations, chemical vapor deposition (CVD) or ALD can be used to deposit a layer of tungsten or physical vapor deposition (PVD) may be used to deposit a layer of TiN over the patterned first metal layer 16. As illustrated by FIG. 10, the third metal layer 24 is deposited conformally, rounding the square cross sectional shapes of the patterned first metal layer 16 and filling the spaces between the patterns in the first metal layer. The resulting shape could, in various implementations, be approximated as a set of hemispheres joined together.

Figure 11:
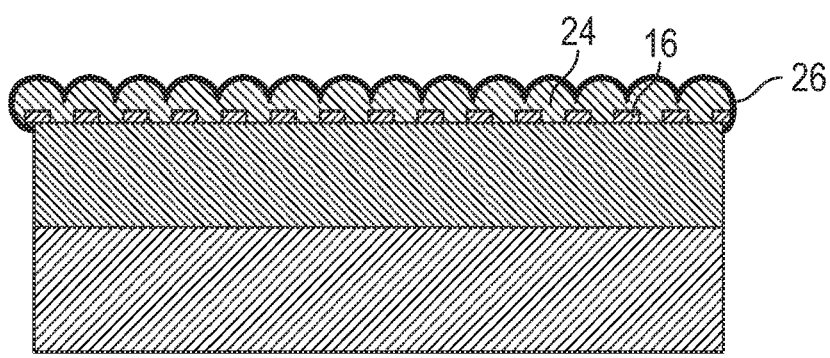
FIG. 11 is a cross sectional side view of an implementation of a dielectric layer coupled over the third metal layer of FIG. 10.
Figure 12:
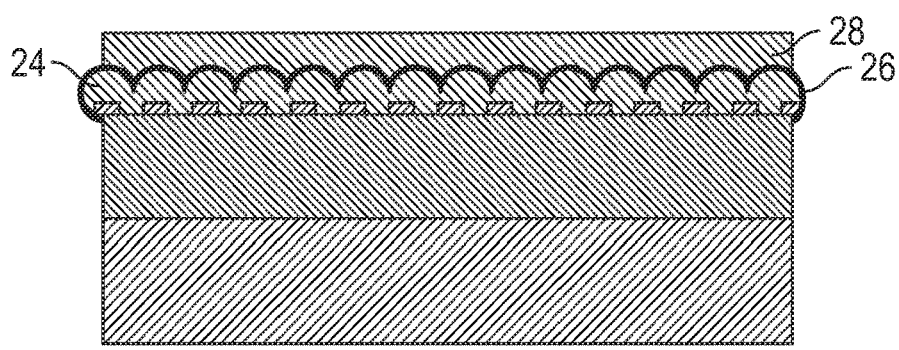
FIG. 12 is a cross sectional side view of an implementation of a second metal layer coupled over the dielectric layer of FIG. 11.
Figure 13:
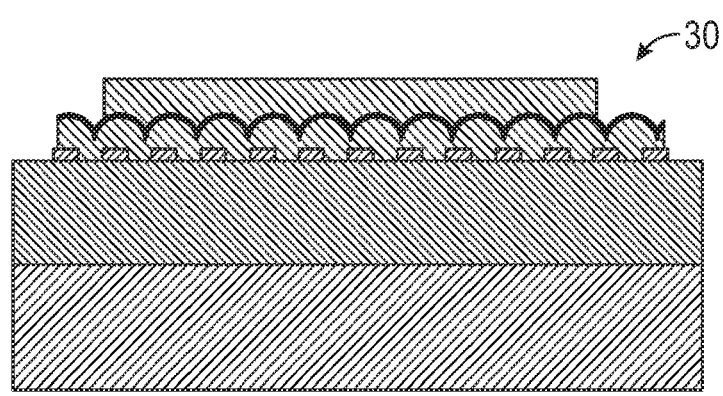
FIG. 13 is a cross sectional side view of another implementation of a MIM capacitor.
Figure 14:
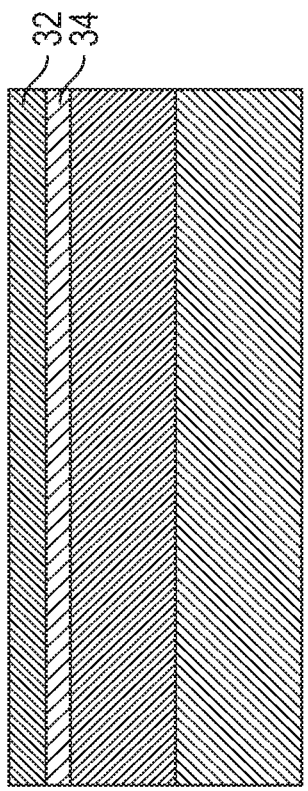
FIG. 14 is a cross sectional side view of an implementation of a first metal layer coupled over a substrate.
Figure 15:
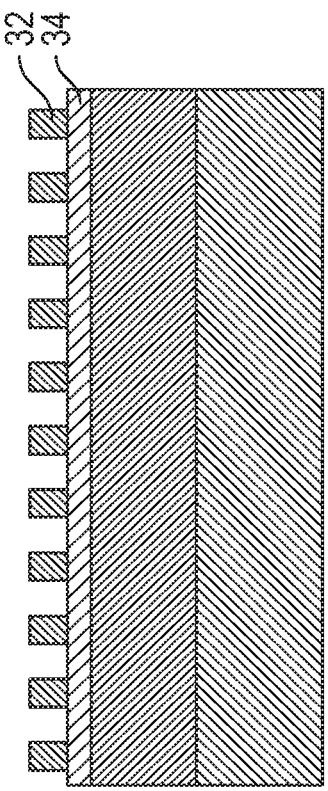
FIG. 15 is a cross sectional side view of the first metal layer of FIG. 14 patterned.
Figure 16:
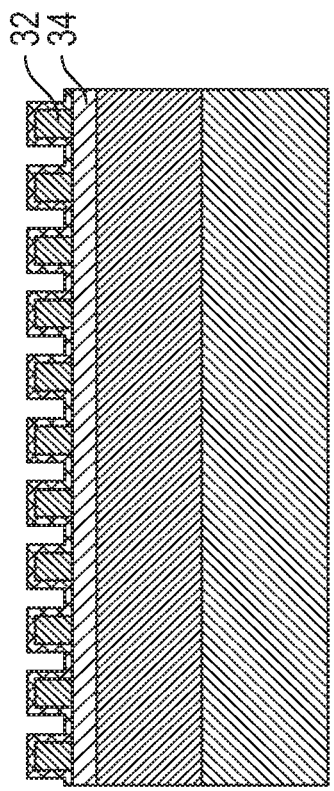
FIG. 16 is a cross sectional side view of an implementation of a dielectric layer coupled over the first metal layer of FIG. 15.
Figure 17:
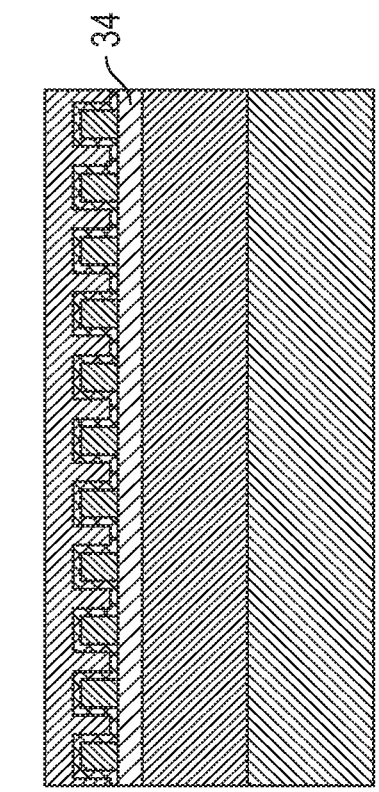
FIG. 17 is a cross sectional side view of an implementation of a second metal layer coupled over the dielectric layer of FIG. 16.
Figure 18:
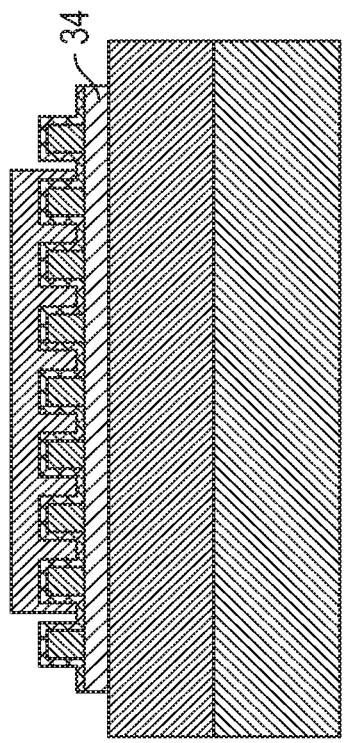
FIG. 18 is another implementation of a MIM capacitor.

Referring to FIG. 11, a cross sectional side view of a dielectric layer coupled over the third metal layer of FIG. 10 is illustrated. In various implementations, the method of forming a capacitor includes depositing a dielectric layer 26 over the first metal layer (and in the implementation illustrated by FIG. 10, directly over the third metal layer). The dielectric layer may be deposited using CVD and may include any type and/or thickness of dielectric layer disclosed herein. Referring to FIG. 12, a cross sectional side view of a second metal layer coupled over the dielectric layer of FIG. 11 is illustrated. In various implementations the method of forming a capacitor may include, following deposition of the dielectric layer 26, depositing a second metal layer 28 over the dielectric layer to form a MIM capacitor. The second metal layer 28 may form the upper electrode. As illustrated, the upper electrode, or second metal layer 28, may, after deposition, be planarized following deposition (by using chemical mechanical planarization (CMP) and/or polishing in various implementations) to ensure the upper layer of the capacitor forms a plane substantially parallel with a plane formed by the substrate 18 or insulative layer 20. Also, as illustrated by FIG. 13, which illustrates a cross sectional side view of another implementation of a MIM capacitor, following planarization, additional patterning steps, including any patterning methods disclosed herein, may be employed to shape the final edges of the MIM capacitor 30 and connect it with various vias and other structures to allow charge to be stored and discharged from the structure.

The increase in surface area of the resulting capacitor with bottom and top electrodes having topography can be estimated by using a radius for each of the openings formed. Where the underlying pitch of the pattern of the patterned lower electrode is 60 nm and the height of the deposited opening is 30 nm (or the pitch is about twice that of the height of the opening), using the area of the resulting opening ($2\pi r^2$), the resulting film increases the capacitance of the MIM capacitor by about 2 times over the equivalent planar MIM capacitor design. In particular implementations, the capacitance of the capacitor may be greater than or equal to 25 femtofarads/square micron. In other implementations, the capacitance may be less than this.

In other implementations, the method of forming a capacitor may be similar to the method described herein relating to FIGS. 6-13, with the difference in that the capacitor may not include the third metal layer. In such implementations, the first metal layer would form the lower electrode and the dielectric layer would be directly coupled over the first metal layer. More specifically, following the patterning of a first metal layer to form a patterned lower electrode using a diblock copolymer implementation, the capacitor dielectric may then be deposited directly onto the patterned first metal layer. The second metal layer is then deposited over the capacitor dielectric (and may be planarized in various implementations) to form the upper electrode. The upper and lower electrodes may then be further patterned to form the MIM capacitor. As can be observed in this implementation, the step of conformally forming additional layer(s) on a seed layer is not done in this implementation. Calculating the change in capacitance for this version indicates that if the pattern in the bottom electrode has a 120 nm pitch and a 60 nm height, the capacitance can be increased by a factor of two over a simply planar MIM capacitor. This method may be illustrated by FIGS. 14-18 (and noting that FIGS. 14-18 also include a conductive layer 34 between the first metal layer and the substrate which may include tungsten). Referring to FIGS. 14-18, another implementation of a method of forming a capacitor with electrode topography is illustrated. In addition to being similar to the method of FIGS. 6-13, the method may also be similar to the method disclosed herein relating to FIGS. 1-5, with the primary difference being that the first metal layer 32 may be patterned using a diblock copolymer rather than lithography. The diblock copolymer used may be any disclosed herein and may pattern the first metal layer in any pattern disclosed herein.

Figure 19:
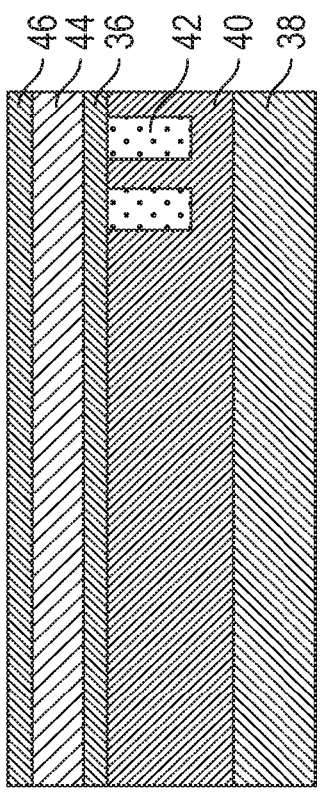
FIG. 19 is a cross sectional side view of an implementation of a first, second, and third metal layer coupled over a substrate.

Referring to FIGS. 19-26, another implementation of forming a capacitor having electrode topography is illustrated. Referring specifically to FIG. 19, a cross sectional side view of a first, second, and third metal layer coupled over a substrate is illustrated. In various implementations, the first, second, and third metal layers can be considered as part of a lower electrode stack. The method of forming a capacitor may include depositing a first metal layer 36 over a substrate 38. The first metal layer 36 may be any type of metal layer disclosed herein and in particular implementations may include Ti or TiN. The substrate 38 may be any type of substrate disclosed herein. In various implementations, an insulative layer 40 (which may be the same as any insulative layer disclosed herein) may be coupled between the first metal layer 36 and the substrate 38. As illustrated by FIG. 19, the insulative layer 40 may include one or more vias 42 therein, contacting underlying metal interconnect layers (not shown). The method may also include depositing a second metal layer 44 over the first metal layer 36. The second metal layer may include any type of metal or alloy thereof disclosed herein, and in particular implementations, may include aluminum or an alloy thereof. The method may also include depositing a third metal layer 46 over the second metal layer 44. The third metal layer 46 may be considered as the lower electrode of the capacitor to be formed. The third metal layer 46 may by any type of metal disclosed herein, and in particular implementations, may include the same type of metal as the first metal layer 36. The second metal layer 44 may serve as an interconnect in some regions of the device and may also function as a portion of the lower electrode stack of the MIM capacitor in various implementations.

Figure 22:
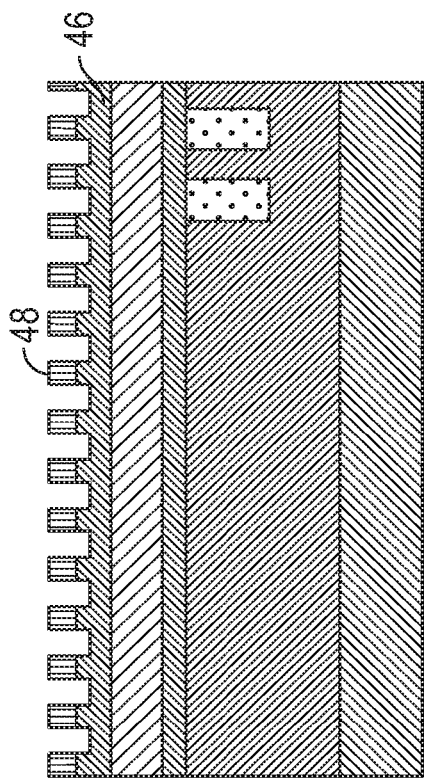
FIG. 22 is a cross sectional side view of the implementation of the third metal layer of FIG. 21 patterned.
Figure 23:
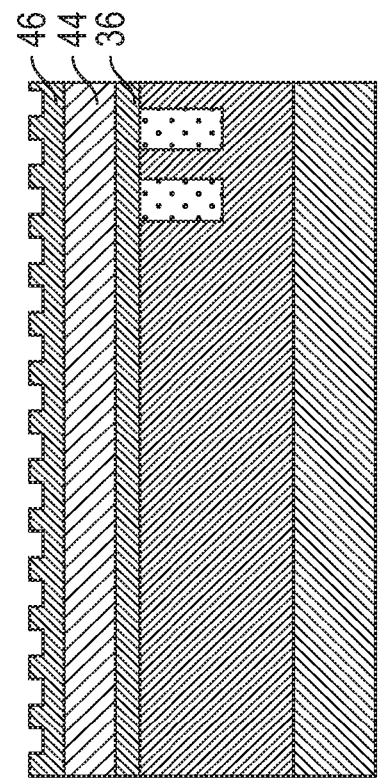
FIG. 23 is a cross sectional side view of the third metal layer of FIG. 22 with the remaining diblock copolymer removed.
Figure 20:
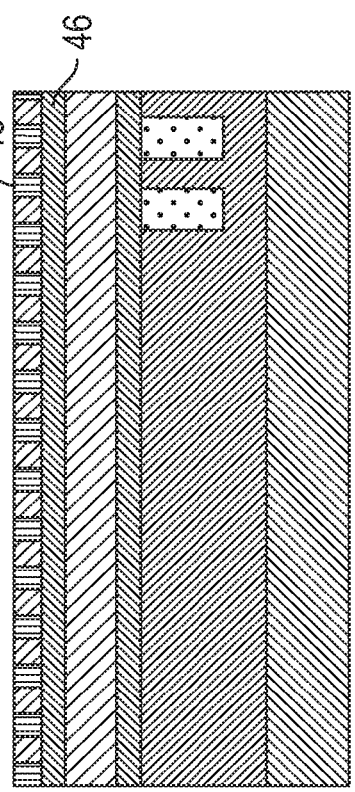
FIG. 20 is a cross sectional side view of an implementation of a diblock copolymer coupled over the third metal layer of FIG. 19.
Figure 21:
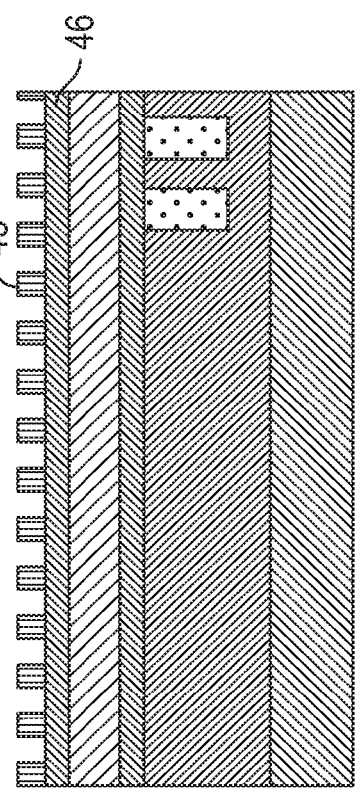
FIG. 21 is a cross sectional side view of the implementation of the diblock copolymer of FIG. 20 patterned.

Referring to FIG. 20, a cross sectional side view of a diblock copolymer coupled over the third metal layer of FIG. 19 is illustrated. The method of forming a capacitor may include forming a diblock copolymer 48 over the third metal layer 46. The diblock copolymer 48 may be any type of diblock copolymer disclosed herein. Referring to FIG. 21, a cross sectional side view of the diblock copolymer of FIG. 20 patterned is illustrated. In implementations including a diblock copolymer 48, the method of forming a capacitor includes selectively removing a portion of the diblock copolymer. The diblock copolymer 48 may be patterned using any implementation disclosed herein. Referring to FIG. 22, a cross sectional side view of the third metal layer of FIG. 21 patterned is illustrated. In various implementations, the method of forming the capacitor includes patterning the third metal layer 46 using the remaining portion of the diblock copolymer 48, and then removing the remaining portion of the diblock copolymer, as illustrated by FIG. 23. The third metal layer may be patterned similar to or the same as any other patterning of a metal layer disclosed herein. As illustrated by FIGS. 22-23, in various implementations the patterning of the third metal layer 46 may be etched and/or otherwise formed only partially through the third metal layer. In various implementations, various etch chemistries could be employed in various method implementations to etch the third metal layer including, by non-limiting example, short duration chlorine reactive ion etching, carbon tetrafluoride reactive ion etching, or any combination thereof. The use of a fluorine based etch chemistry which is selective to (i.e., does not etch) the second metal layer may reduce the risk of creating voids in the second metal layer during etching and/or patterning of the third metal layer. In various implementations, the third metal layer may also be thickened to increase the process window and reduce the likelihood of voids being present in the second metal layer.

Figure 24:
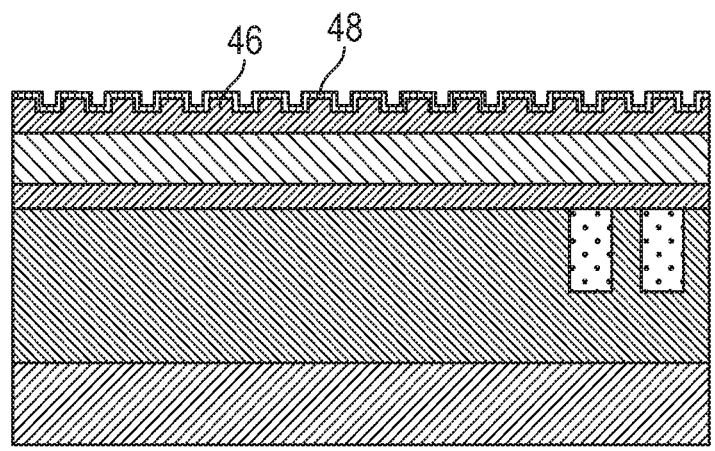
FIG. 24 is a cross sectional side view of an implementation of a dielectric layer coupled over the third metal layer of FIG. 23.
Figure 25:
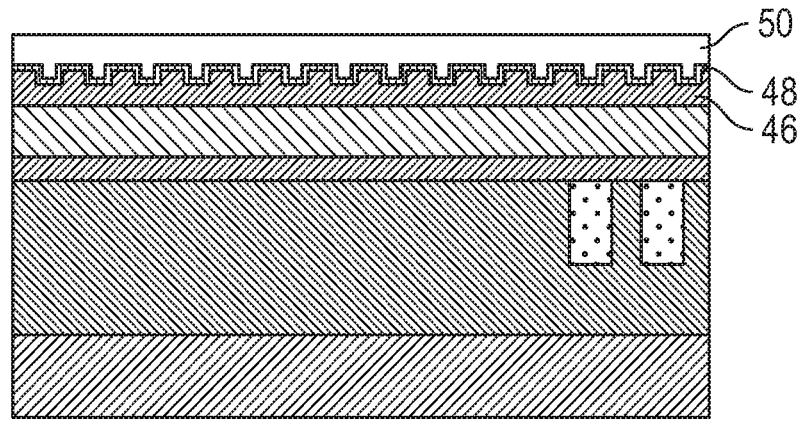
FIG. 25 is a cross sectional side view of an implementation of a fourth metal layer coupled over the dielectric layer of FIG. 24.
Figure 26:
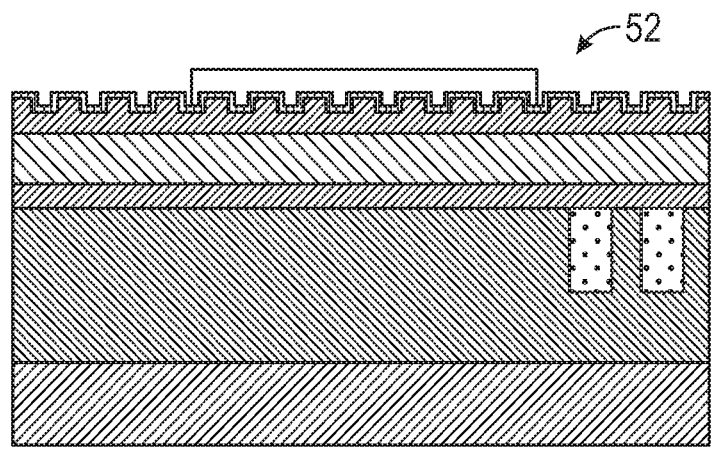
FIG. 26 is a cross sectional side view of another implementation of a capacitor.
Figure 27:
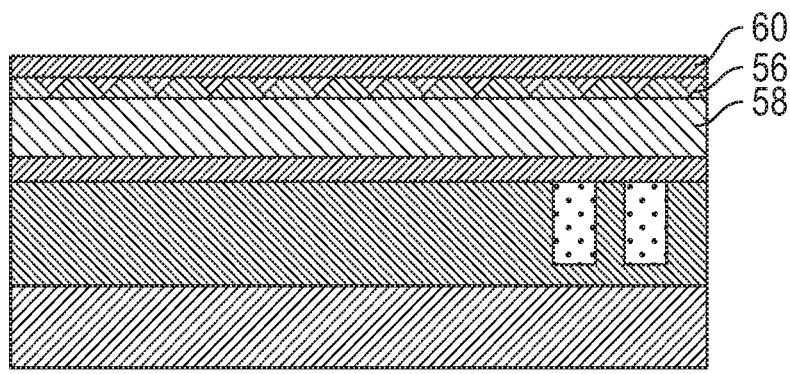
FIG. 27 is a cross sectional side view of implementations of a first, second, third, and fourth metal layer coupled over a substrate.
Figure 28:
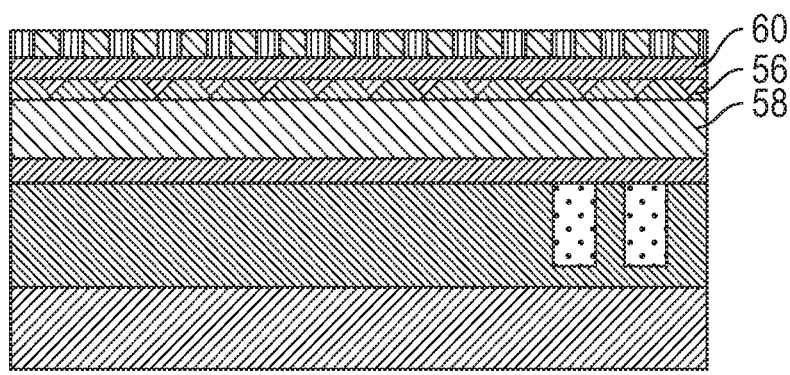
FIG. 28 is a cross sectional side view of an implementation of a diblock copolymer coupled over the third metal layer of FIG. 27.
Figure 29:
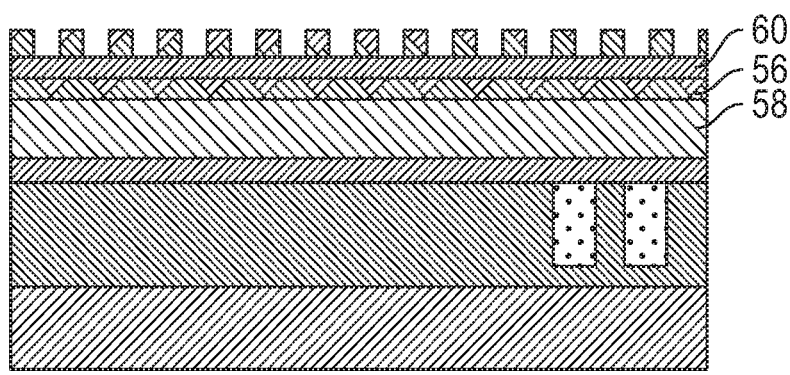
FIG. 29 is a cross sectional side view of the diblock copolymer of FIG. 28 patterned.
Figure 30:
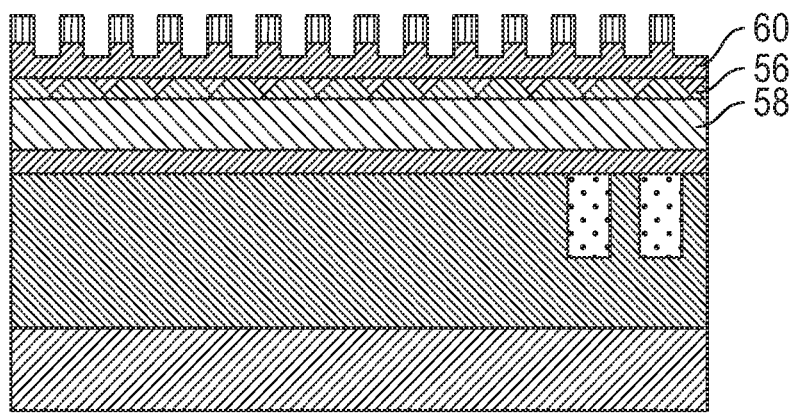
FIG. 30 is a cross sectional side view of the third metal layer of FIG. 29 patterned.
Figure 31:
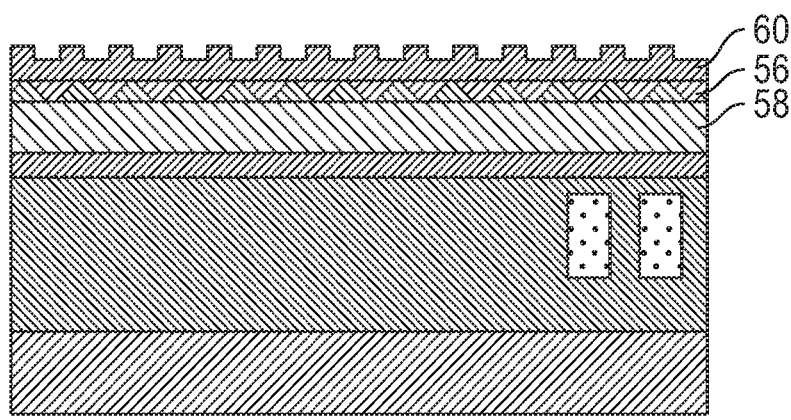
FIG. 31 is a cross sectional side view of the third metal layer of FIG. 30 with the remaining diblock copolymer removed.

Referring to FIG. 24, a cross sectional side view of a dielectric layer coupled over the third metal layer of FIG. 23 is illustrated. The method of forming a capacitor may include depositing a dielectric layer 49 over the third metal layer 46. The dielectric layer may be the same as or similar to any dielectric layer disclosed herein and may be deposited using any deposition method disclosed herein. Referring to FIG. 25, a cross sectional side view of a fourth metal layer coupled over the dielectric layer of FIG. 24 is illustrated. In various implementations, the method of forming a capacitor may include depositing a fourth metal layer 50 over the dielectric layer 49 to form a MIM capacitor. The fourth metal layer 50 may form the upper electrode of the capacitor and may be the same as or similar to any other upper electrode metal layer disclosed herein. Also as illustrated by FIG. 26, which illustrates a cross sectional side view of another implementation of a capacitor, following deposition of the fourth metal layer 50, additional patterning steps may be employed to shape the final edges of the MIM capacitor 52 and connect it with various vias and other structures to allow charge to be stored and discharged from the structure. The capacitor illustrated by FIG. 26 may have an increased capacitance similar to any other capacitor disclosed herein.

Referring to FIGS. 27-31, a semiconductor device implementation after various method steps of another implementation of a method for forming a capacitor having electrode topography is illustrated. The method steps illustrated by FIGS. 27-31 may be the same as the steps method illustrated by FIGS. 19-23, with the difference being that the method illustrated by FIGS. 27-31 includes depositing a fifth metal layer 56 between the second metal layer 58 and the third metal layer 60. The fifth metal layer may include any type of metal or alloy thereof, and in particular implementations may include tungsten. In various implementations, the fifth metal layer may be a protective layer and prevent the creation of voids or other damage in the second metal layer 58 resulting from the patterning of the third metal layer. Though not illustrated, a dielectric layer and a fourth metal layer may be formed over the third metal layer of FIGS. 27-31 to form a MIM capacitor similar to the dielectric layer, the third metal layer, and the method disclosed in FIGS. 24-26.

Figure 32:
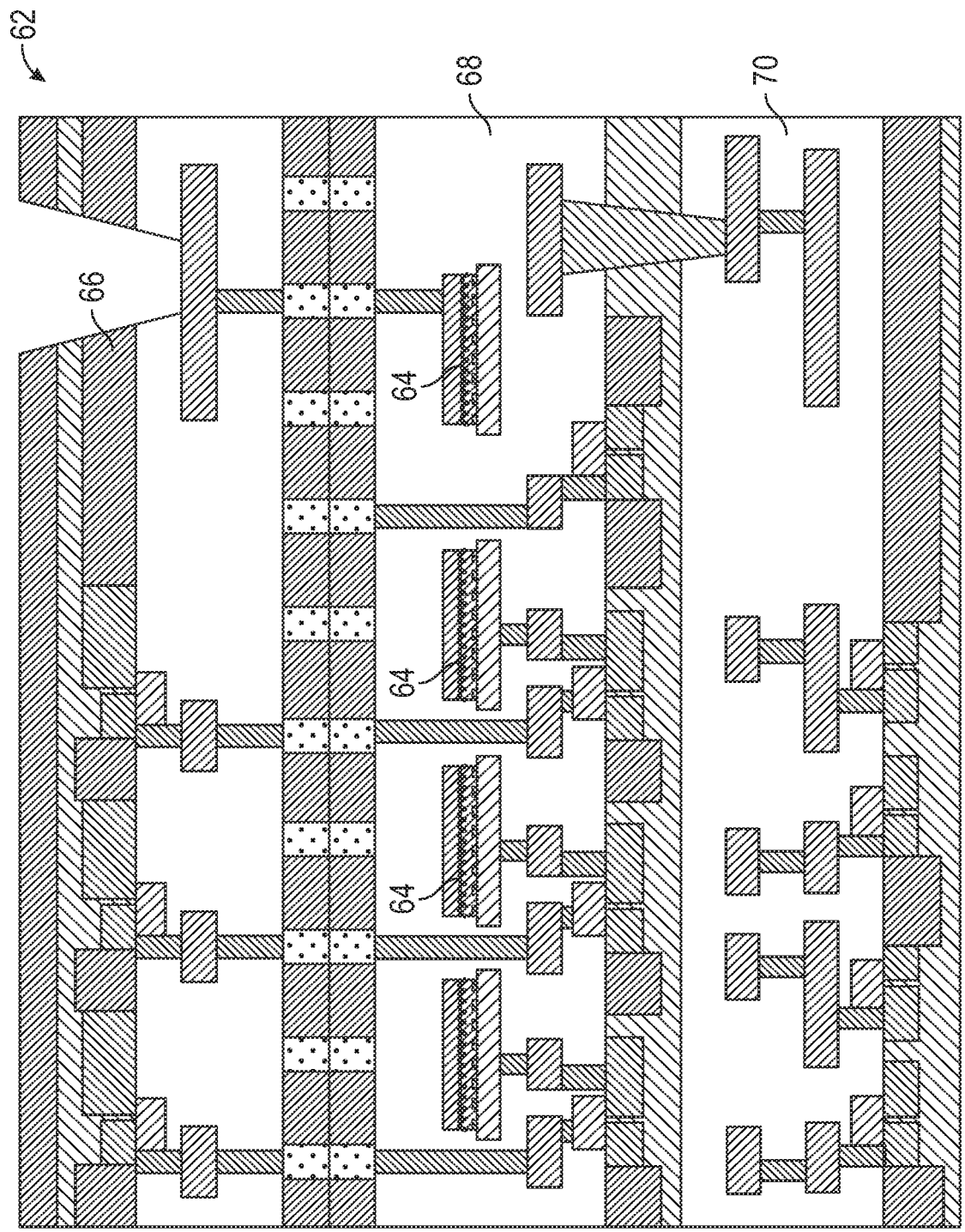
FIG. 32 is a cross sectional side view of an implementation of a stacked image sensor.

Referring to FIG. 32, a cross sectional side view of a stacked image sensor is illustrated. The stacked image sensor 62 may be a three die backside illuminated (BSI) image sensor. In various implementations, an image sensor 62 may include a first die 66, a second die 68, and a third die 70. In various implementations, the image sensor 62 includes a plurality of capacitors 64 therein. The plurality of capacitors 64 may be included in the second die 68 between the first die 66 and the third die 70. In various implementations, the middle die may include only capacitors and the associated routing and none of the other pixel related devices. The capacitors 64 may be any type of capacitor disclosed herein. In various implementations, not all of the capacitors 64 included in the design may be electrically active, but their structure may be included to improve wafer processing and/or minimize topographical variations across the wafer during wafer bonding.

Figure 33:
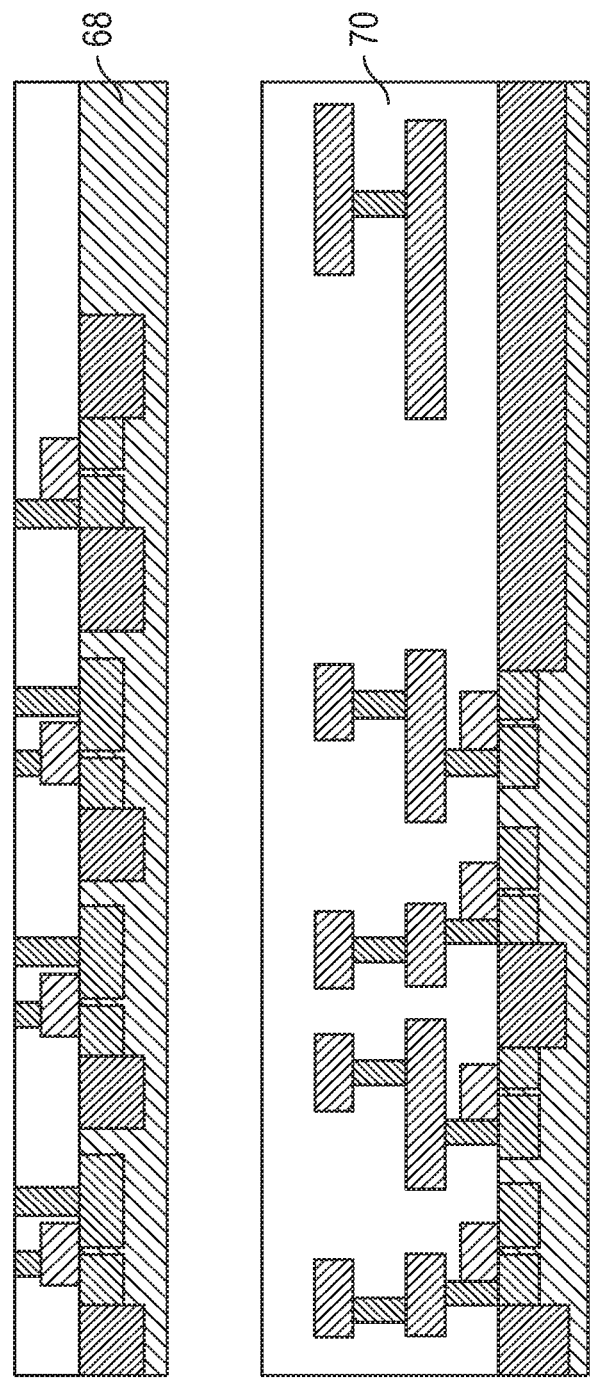
FIG. 33 is a cross sectional side view of implementations of an second substrate and a third substrate.
Figure 34:
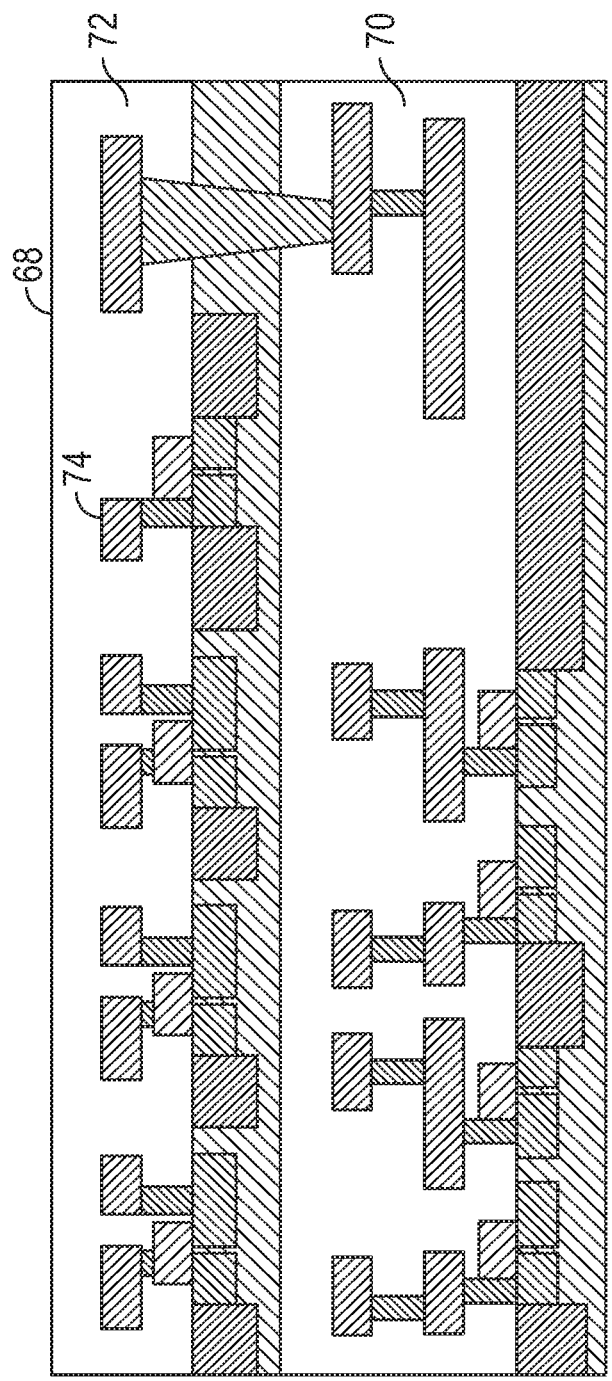
FIG. 34 is a cross sectional side view of the second substrate of FIG. 33 coupled to the third substrate.
Figure 35:
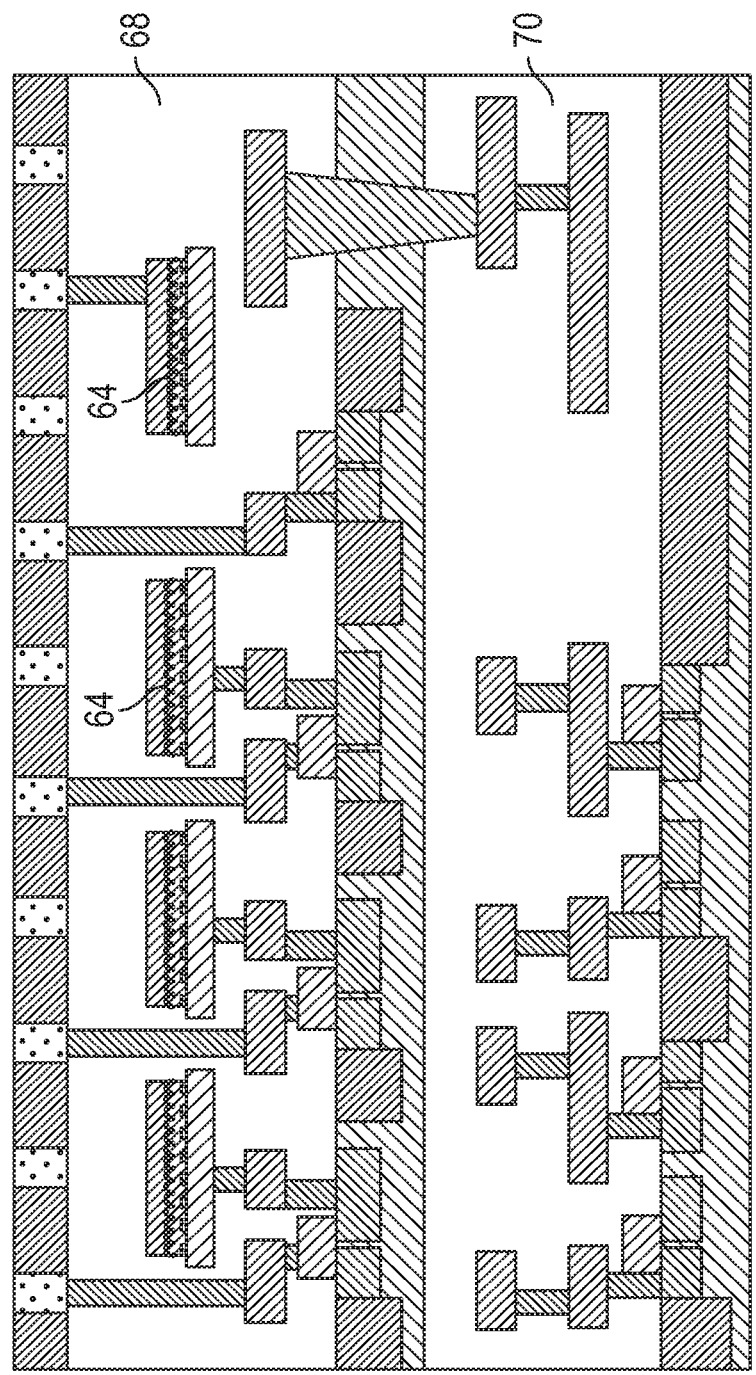
FIG. 35 is a cross sectional side view of an implementation of a plurality of capacitors formed in the second substrate.
Figure 36:
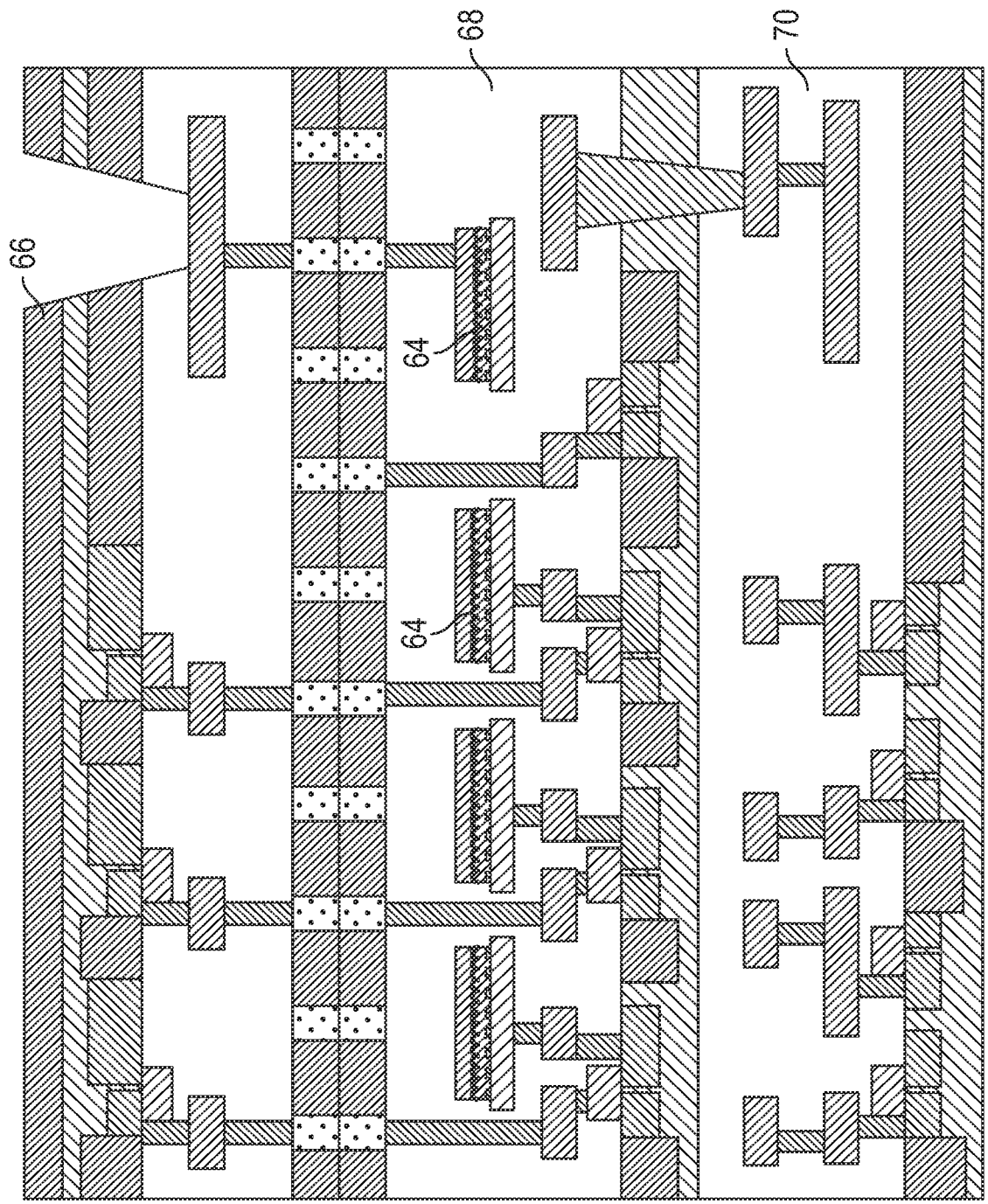
FIG. 36 is a cross sectional side view of an implementation of a first substrate coupled to the second substrate of FIG. 35.

Referring to FIGS. 33-36, the process of preparing the image sensor of FIG. 32 is illustrated. Referring to FIG. 33, a cross sectional side view of a second substrate and a third substrate are illustrated. As illustrated, the second substrate 68, which include the pixel devices and related capacitors is thinned. The third substrate 70 may include the digital signal processing components of the image sensor. In various implementations, a handle/carrier wafer and adhesive may be bonded to the second substrate 68 during its thinning process. Referring to FIG. 34, a cross sectional side view of the second substrate coupled to the third substrate is illustrated. The method of forming the image sensor of FIG. 32 includes coupling the second substrate to the third substrate 70 and forming a through silicon via 72 connection between the second substrate and the third substrate. The method may also include forming a layer of metal traces 74 on the second substrate. As illustrated by FIG. 35, the combined second and third substrates are then processed to form the capacitors 64. The method may also include coupling a first substrate 66 to the second substrate 68. The first substrate 66 may include a set of bond pads for use in bonding the second substrate 68 to the first substrate 66. The first substrate 66 may include the image sensor array, photodiode and transfer gate components. Following bonding of the first substrate 66 to the second substrate 68, additional backside processing to the first substrate 66 which includes the image sensor components may be carried out in various implementations. As illustrated in FIG. 36, the first substrate may then be bonded to the second substrate to form a plurality of three die stack BSI image sensor devices.

A wide variety of other method implementations to form the MIM capacitors disclosed herein and incorporate them into an image sensor device or other semiconductor device may be constructed using the principles disclosed herein.

In places where the description above refers to particular implementations of capacitors and implementing components, sub-components, methods and sub-methods, it should be readily apparent that a number of modifications may be made without departing from the spirit thereof and that these implementations, implementing components, sub-components, methods and sub-methods may be applied to other capacitors.

What is claimed is:

1. A method of forming a capacitor comprising:
depositing a first metal layer over a substrate;
coupling a diblock copolymer over the first metal layer;
selectively removing a portion of the diblock copolymer;
patterning the first metal layer using a remaining portion of the diblock copolymer;
depositing a dielectric layer over the first metal layer;
depositing a second metal layer over the dielectric layer to form a metal-insulator-metal (MIM) device; and
coupling a third metal layer between the first metal layer and the dielectric layer, the third metal layer at least partially comprising a lower electrode;
wherein the first metal layer is coupled with the dielectric layer only indirectly through one or more other elements.

2. The method of claim 1, wherein the first metal layer at least partially comprises the lower electrode.

3. The method of claim 1, wherein the second metal layer is an upper electrode.

4. The method of claim 1, wherein the first metal layer is a seed layer.

5. The method of claim 1, wherein the first metal layer and the second metal layer comprise titanium.

6. A method of forming a capacitor comprising:
coupling a tungsten layer between a first metal layer and a substrate
coupling a diblock copolymer over the first metal layer;
selectively removing a portion of the diblock copolymer;
patterning the first metal layer using a remaining portion of the diblock copolymer;
depositing a dielectric layer over the first metal layer; and
depositing a second metal layer over the dielectric layer to form a metal-insulator-metal (MIM) device.

7. The method of claim 6, further comprising coupling a third metal layer between the first metal layer and the dielectric layer, the third metal layer at least partially comprising a lower electrode.

8. The method of claim 7, wherein the third metal layer fully physically isolates the first metal layer from the dielectric layer.

9. The method of claim 8, wherein the first metal layer is coupled with the dielectric layer only indirectly through one or more other elements.

10. The method of claim 6, wherein the first metal layer at least partially comprises a lower electrode.

11. The method of claim 6, wherein the second metal layer at least partially comprises an upper electrode.

12. The method of claim 6, wherein the first metal layer is a seed layer.

13. The method of claim 6, wherein the first metal layer and the second metal layer comprise titanium.

14. A method of forming a capacitor comprising:
depositing a first metal layer over a substrate;
coupling a diblock copolymer over the first metal layer;
selectively removing a portion of the diblock copolymer;
patterning the first metal layer using a remaining portion of the diblock copolymer;
depositing a dielectric layer over the first metal layer; and
depositing a second metal layer over the dielectric layer to form a metal-insulator-metal (MIM) device;
wherein a capacitance of the capacitor is greater than or equal to 25 femtofarads/square micron.

15. The method of claim 14, further comprising coupling a third metal layer between the first metal layer and the dielectric layer, the third metal layer at least partially comprising a lower electrode.

16. The method of claim 15, wherein the first metal layer is coupled with the dielectric layer only indirectly through one or more other elements.

17. The method of claim 14, wherein the first metal layer at least partially comprises a lower electrode.

18. The method of claim 14, wherein the second metal layer at least partially comprises an upper electrode.

19. The method of claim 14, wherein the first metal layer is a seed layer.

20. The method of claim 14, wherein the first metal layer and the second metal layer comprise titanium.

* * * * *